(12) United States Patent
Yamada

(10) Patent No.: US 8,664,910 B2
(45) Date of Patent: Mar. 4, 2014

(54) ELECTRONIC DEVICE WITH POWER GENERATION FUNCTION

(75) Inventor: Kouji Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 1024 days.

(21) Appl. No.: 12/447,518

(22) PCT Filed: Oct. 26, 2007

(86) PCT No.: PCT/JP2007/070935
§ 371 (c)(1),
(2), (4) Date: Apr. 28, 2009

(87) PCT Pub. No.: WO2008/053809
PCT Pub. Date: May 8, 2008

(65) Prior Publication Data
US 2010/0033125 A1    Feb. 11, 2010

(30) Foreign Application Priority Data

Nov. 2, 2006 (JP) ................................ 2006-299168

(51) Int. Cl.
*H01M 10/44* (2006.01)
(52) U.S. Cl.
USPC .......................................... 320/101; 362/97.1
(58) Field of Classification Search
USPC ........................................................ 320/101
See application file for complete search history.

(56) References Cited

U.S. PATENT DOCUMENTS

| 8,113,704 B2 * | 2/2012 | Bae et al. ...................... 362/613 |
| 2002/0168948 A1 * | 11/2002 | Watanabe ........................ 455/90 |
| 2004/0125078 A1 | 7/2004 | Nishimori et al. |

(Continued)

FOREIGN PATENT DOCUMENTS

| JP | 2-117583 U | 9/1990 |
| JP | 04-034044 A | 3/1992 |

(Continued)

OTHER PUBLICATIONS

International Search Report for PCT/JP2007/070935 mailed Jan. 22, 2008.

(Continued)

*Primary Examiner* — Edward Tso
*Assistant Examiner* — Johali Torres Ruiz
(74) *Attorney, Agent, or Firm* — Sughrue Mion, PLLC

(57) ABSTRACT

The present invention provides an electronic device with a secondary cell which has a simple structure and is capable of extending a continuous operating period by compensating for power consumption through effective utilization of a light source and external light. On a rear face of a casing 201 of a mobile phone, a light source 204, a conductive key sheet 203 having a plurality of operation keys 206 and a solar battery 202 are layered. Each of the operation keys 206 is exposed outwards through a through-hole 208 of the solar battery 202 and a through-hole 207 of the casing 201. The key sheet 203 guides the light from the light source 204 and the light from the outside of the casing 201 to the solar battery 202 and guides the light from the light source 204 onto the operation key 206. The solar battery 202 receives the light from the light source 204 and the outside of the casing 201 through the key sheet 203 and converts the light into electric energy to be charged into a secondary cell.

5 Claims, 7 Drawing Sheets

(56) References Cited

U.S. PATENT DOCUMENTS

| | | | |
|---|---|---|---|
| 2005/0093768 A1* | 5/2005 | Devos et al. | 345/1.3 |
| 2006/0118166 A1* | 6/2006 | Iwaki | 136/263 |
| 2006/0262562 A1* | 11/2006 | Fukasawa et al. | 362/615 |
| 2007/0080925 A1* | 4/2007 | Radivojevic et al. | 345/105 |

FOREIGN PATENT DOCUMENTS

| | | |
|---|---|---|
| JP | 1996262997 A | 10/1996 |
| JP | 1998222113 A | 8/1998 |
| JP | 11-296100 A | 10/1999 |
| JP | 2001292214 A | 10/2001 |
| JP | 2002055628 A | 2/2002 |
| JP | 2002077343 A | 3/2002 |
| JP | 2004013145 A | 1/2004 |
| JP | 2004178551 A | 6/2004 |

OTHER PUBLICATIONS

Office action in JP counterpart patent application 368439, dated Jun. 5, 2012.

Japanese Office Action for JP 2012-168755 mailed on Jun. 4, 2013 with English Translation.

* cited by examiner

US 8,664,910 B2

ELECTRONIC DEVICE WITH POWER GENERATION FUNCTION

This application is the National Phase of PCT/JP2007/070935, filed Oct. 26, 2007, which is based upon and claims the benefit of priority from Japanese patent application No. 2006-299168, filed on Nov. 2, 2006, the disclosure of which is incorporated herein in its entirety by reference.

TECHNICAL FIELD

The present invention relates to a portable electronic device such as a mobile phone, PHS (Personal Handyphone System) or PDA (Personal Digital Assistant) and an electronic device such as a display unit and, in particular, to an electronic device equipped with a power generation function.

BACKGROUND ART

A portable electronic device operated on a battery of a mobile phone, PHS or PDA as a power supply thereof has conventionally been developed.

A conventional portable electronic device, for example, a mobile phone is powered by a battery and therefore when the battery works out, the device needs to replace it properly or in use of a secondary cell, the device needs to charge the cell, for example, as disclosed in Patent Documents 1 to 3.

However, there occur the following problems that battery replacement accompanies cost and battery replacement or charging needs time and trouble.

As a method for solving such problems, there has been proposed an invention which charges a secondary cell with a solar battery using a light source for backlight and external light, as disclosed in Patent Document 1. However, the invention disclosed in Patent Document 1 uses a light source as only a backlight of a display unit. An electronic device having operation keys illuminates the operation keys using the light source and therefore when the operation keys are illuminated by optical guiding using an optical fiber, the following problem occurs: a structure of the electronic device becomes very complicated.

In addition, the electronic device is configured to charge a solar battery with solar light which has penetrated through the display unit and therefore when the translucency of the display unit is low, the solar battery causes insufficient power generation.

Therefore, a portable electronic device requires a simple structure for good charging as well as extension of a battery drivable period and long lifetime.

In the case of an electronic device having a display element, a light-emitting device is used as a pixel and, in the case of a pixel of a non-light emitting type, a backlight is used, thus causing power consumption for illumination. Therefore, there occurs a serious problem of need for reduction in supply power.

Patent Document 1: Japanese Patent Laid Open Publication No. 2002-77343
Patent Document 2: Japanese Patent Laid Open Publication No. 2001-292214
Patent Document 3: Japanese Patent Laid Open Publication No. 2002-55628

DISCLOSURE OF THE INVENTION

Problems to be Solved by the Invention

It is an exemplary object of the present invention to provide an electronic device with a secondary cell which has a simple structure and is capable of extending a continuous operating period by compensating for power consumption through effective utilization of a light source and external light.

Means for Solving the Problems

An exemplary aspect of the present provides an electronic device including: a light source; a photoelectric conversion element for receiving light and converting the light into electric energy; a key sheet for having a plurality of operation keys and guiding the light from the light source and external light into the photoelectric conversion element and guiding the light from the light source onto the operation key; and a secondary cell for storing electric energy from the photoelectric conversion element.

The key sheet includes a plurality of operation keys and guides the light from the light source and external light into a photoelectric conversion element and guides the light from the light source onto the operation key. The photoelectric conversion element receives the light from the key sheet and converts the light into electric energy. The secondary cell stores electric energy from the photoelectric conversion element.

It may be configured that the electric device includes a casing including a plurality of first through-holes for exposing the plurality of operation keys to a surface side thereof; the photoelectric conversion element includes a plurality of second through-holes corresponding to the first through-holes and is disposed on a rear face of the casing; the key sheet is made of a material with light conductivity and is disposed on the rear face of the photoelectric conversion element and the plurality of operation keys protrude to the outside of the casing through the first and second through-holes; the light source is disposed on a rear face of the key sheet; and the key sheet guides the light from the light source and the external light from the outside of the casing into the photoelectric conversion element.

It may be configured that an area of an external face of the operation key protruding to the outside of the casing is formed to be larger than the first and the second through-holes.

In addition, it may be configured that the light source is a backlight of the operation key.

Further, it may be configured that the light source is formed to have translucency and to be layered on the photoelectric conversion element.

It may be configured that the photoelectric conversion element is formed to be layered on the secondary cell.

An exemplary aspect of the present invention provides an electronic device including a plurality of optical charging elements, each of which includes a light source with translucency; a photoelectric conversion element layered on a lower layer of the light source for converting the light from the light source and external light into electric energy; and a secondary cell layered on a lower layer of the optical conversion element for storing the electric energy from the optical conversion element, wherein the electric device uses the light source of the each optical charging element as a pixel.

A photoelectric conversion element is layered on a lower layer of a light source having translucency and converts the light from the light source and external light into electric energy. A secondary cell is layered on a lower layer of the optical conversion element and stores electric energy from the optical conversion element. A light source of each optical charging element is used as a pixel.

It may be configured that the each optical charging element is formed to include protrusions and recesses around there wherein the protrusions and the recesses of the each optical charging element engage with recesses and protrusions of respective adjacent optical charging elements.

It may be configured that the each optical charging element is independent of any other optical charging element to be removed independently.

In addition, it may be configured that the light source of the each optical charging element is used as a pixel backlight in place of a pixel.

Advantages of the Invention

According to the present invention, the power consumption of a power supply can be compensated for with a simple structure by effective utilization of a light source and external light.

An electronic device with a secondary cell such as a mobile phone charges the cell by a light source and external light through a key sheet, thus can extend a continuous operating period.

In addition, a display unit uses a light source as a pixel or backlight, therefore with a simple structure, it can be achieved to compensate for electric power supplied from a power supply.

BEST MODE FOR CARRYING OUT THE INVENTION

FIG. 1 is a block diagram illustrating a configuration of an electronic device with a power generation function according to a first exemplary embodiment of the present invention and illustrates an example of a mobile phone with a solar battery.

In FIG. 1, a mobile phone 101 includes: an antenna 102; a communication unit 103 which performs wireless communication; a control unit 104 which includes a CPU and performs control and signal processing of each unit; a speaker 105 which outputs a ring alert and a beep sound; a microphone 106 which inputs a sound; an operation unit 107 which includes operation keys such as a ten key and various types of function keys and is used to make inputs for a telephone number and various types of operations; a display unit 108 which is constructed from a liquid crystal display panel and displays various types of information such as device operating states; a storage unit 109 which stores various types of information such as music data in a memory such as a flash memory; a music replay unit 110 which includes a DSP and performs various types of processing for music replay; a solar battery unit 111 which converts optical energy into electric energy; a charging power control unit 112 which performs charging control and power control of each unit; a charging battery 113 which is a secondary cell; and a light source unit 114 which illuminates an incoming alert LED (light emitting diode) and various types of function illuminations.

FIG. 2 is an exploded perspective view illustrating a configuration of a mechanism portion of the mobile phone 101 with a power generation function according to the first exemplary embodiment of the present invention.

In FIG. 2, there are illustrated a solar battery 202 which is a photoelectric conversion element disposed at a rear face of a casing 201, a key sheet 203 which is disposed on a rear face of the solar battery 202 and guides, reflects and passes light and a light source 204 which is disposed on a rear face of the key sheet 203 and includes a plurality of LEDs.

The casing 201 includes a plurality of first through-holes 207 for exposing a plurality of operation keys 206 integrally formed on the key sheet 203 to a front side of the casing 201. The sheet-like solar battery 202 includes a plurality of second through-holes 208 corresponding to the first through-holes 207 and is disposed on a rear face of the casing 201. The key sheet 203 is made of a material with light conductivity and is disposed on the rear face of the solar battery 202. The plurality of operation keys 206 is integrally formed on the key sheet 203, each of which protrudes outward from the front side of the casing 201 through the first and the second through-holes 207, 208 corresponding to the each key.

The light emitted from the light source 204 is irradiated to the key sheet 203. A part of the light emitted from the light source 204 is guided by the key sheet 203 onto the operation key 206 integrally formed on the key sheet 203, and applied to the operation key 206. A part of the light emitted from the light source 204 is guided by the key sheet 203 and applied to the solar battery 202. In addition, the light from the external light 205, after passing through the key sheet 203, is applied to the solar battery 202.

As described above, the key sheet 203 guides the light from the outside of the casing 201 and the light from the light source 204 to the solar battery 202. The light emitted from the light source 204 and the light from the external light 205, after passing through the key sheet 203, are applied to the solar battery 202, and the solar battery 202 converts the received optical energy into electric energy for power generation.

The electric energy generated by the solar battery 202 is charged into the charging battery 113 by the charging power control unit 112 and is used for the power supply of each unit of the mobile phone 101, thus compensating for the current consumption of the battery 113 for extension of a continuous operating period.

FIGS. 3 and 4 are a side sectional view of a mechanism portion of the mobile phone 101 with a power generation function according to the first exemplary embodiment of the present invention, respectively, where the same portions as in FIG. 2 have the same reference numeral/character, respectively.

As illustrated in FIGS. 3 and 4, on the rear face side of the casing 201, the solar battery 202, the key sheet 203 and the plurality of light sources 204 formed on the sheet are layered.

Each of the plurality of operation keys 206 formed on the key sheet 203 protrudes to the front side of the casing 201 through the first through-hole 207 formed on the casing 201 and the second through-holes 208 formed on the sheet of the solar battery 202.

In FIGS. 1 to 4, the light emitted from the light source 204 and the light from the external light 205, such as sunlight and light from an external light fixture (e.g. fluorescent light), after passing through the key sheet 203, is applied to the solar battery 202, and the solar battery 202 converts the received optical energy into electric energy for power generation.

The electric energy converted by the solar battery 202 is charged into the charging battery 113 which is a secondary cell by the charging power control unit 112 and is used for the power supply of each unit of the mobile phone 101, thus compensating for current consumption of the battery 113 for extension of a continuous operating period.

FIG. 5 is a block diagram illustrating the operations in charging the electric energy converted by the solar battery 202 into the charging battery 113 and using the energy for power supply of each unit of the mobile phone 101, where the same portions as in FIGS. 1 to 4 have the same reference numeral/character, respectively.

In FIG. 5, when the light emitted from the light source 204 and the light from the external light 205 are applied to the solar battery 202, the solar battery 202 converts the received optical energy into electric energy. The charging power control unit 112 controls the information of a charging state of the charging battery 113 and a power supply state of each unit of the mobile phone 101 and charges the electric energy converted by the solar battery 202 into the charging battery 113, which is used in the power supply of each unit of the mobile phone 101. By performing photoelectric conversion for converting optical energy into electric energy, the optical energy is reused.

As described above, the electronic device according to the first exemplary embodiment, using a simple structure, effectively absorbs the light from a key backlight illumination unit and the external light 205 as optical energy and converts the energy into electric energy by photoelectric conversion. Because charging can be performed by the light source 204 and the external light 205 through the key sheet 203, the solar battery 202 can compensate for consumption of use current, thus extending the continuous operating period of the mobile phone 101. In addition, the light from the key backlight illumination unit which usually disappears as unnecessary light can be effectively used. Hence, the exemplary embodiment provides various advantages such as reduction in the frequency of troublesome charging of the battery 113 and unnecessary carrying of a charger during a long trip.

As a second exemplary embodiment of the present invention, a basic configuration thereof is as described above, but to effectively apply external light to a solar battery, further devised example will be described below.

FIG. 6 is a side sectional view of an electric device according to the second exemplary embodiment of the present invention and illustrates an example of a mobile phone with a power generation function in the same way as the first exemplary embodiment. In FIG. 6, the same portions as in FIGS. 3 and 4 have the same reference numeral/character, respectively.

In FIG. 6, an area of an external surface of an operation key 206*a* formed on a key sheet 203*a* is set to be larger than the through-holes 207, 208. Specifically, a head portion of the operation key 206*a* is formed to be thicker than a base thereof. Hence, the operation key 206*a* receives more external light 205, thus guiding light onto the solar battery 202.

As described above, by changing a shape of the key sheet 203*a* to guide light with higher efficiency, much light can be easily applied by the solar battery 202, thus attaining high power efficiency.

FIG. 7 is a side sectional view of a light source solar battery 505 which is a component used in an electronic device according to a third exemplary embodiment of the present invention, where the same portions as in FIGS. 1 to 6 have the same reference numeral/character, respectively.

In the third exemplary embodiment, the device is further devised for further effective application of the light from a light source 504 and the external light 205 to the solar battery 202. In FIG. 7, by integrating the light source 504 constructed from LED and an organic EL with the solar battery 202 which is a photoelectric conversion element, a light source solar battery 505 is constructed, thus directly applying the light from the light source 504 to the solar battery 202. Such a structure provides miniaturization of a mobile phone by space saving and a compact design.

The light source 504, made of a translucent material, has translucency and the external light 205 is applied to the solar battery 202 through the light source 504.

As described above, the light source solar battery 505 has an integrated structure by layering the light source 504 and the solar battery 202 and the light source solar battery 505 can be installed directly on a printed circuit board, thus reducing the number of assembling processes toward high manufacturing efficiency.

FIG. 8 is a side sectional view of a light source charging solar battery 601 as a component used in an electronic device according to a fourth exemplary embodiment of the present invention, where the same portions as in FIGS. 1 to 7 have the same reference numeral/character, respectively.

In FIG. 8, the light source charging solar battery 601 is structured to layer and integrate the light source 504 constructed from LED or organic EL, the solar battery 202 as a photoelectric conversion element and the charging battery 113 and constructs an optical charging element.

The light source 504, made of a translucent material, has translucency and the external light 205 is applied to the solar battery 202 through the light source 504. The light from the light source 504 is applied directly to the solar battery 202.

Therefore, the light of the light source 504 and the light from the external light 205 are received by the solar battery 202 and the photoelectric-converted electricity is charged into the charging battery (secondary cell) 113, thereby continuously emitting the light from the light source 504 for a long time by a single body. Only the light source charging solar battery 601 formed by integrating the light source 504, the solar battery 202 and the charging battery 113 can emit the light.

FIG. 9 is a view illustrating an electronic device according to a fifth exemplary embodiment of the present invention and illustrates a perspective view of a light 701 constructed by combining the plurality of light source charging solar batteries 601 illustrated in FIG. 8.

In FIG. 9, the light 701 is structured to arrange the plurality of light source charging solar batteries 601 on a support base 901.

The light 701 constructed by combining the plurality of light source charging solar batteries 601 is available even at a place without electricity or at a dark place.

According to the light 701 according to the exemplary embodiment, the light from the light source 504 and the external light 205 are received by the solar battery 202 and the photoelectric-converted electricity is charged into the battery 113, thus eliminating need for replacing or charging the battery 113 as needed. Hence, this provides a handy-carrying compact portable electric device. The light 701 is also applicable to a light source used in a portable electronic device, for example, to a ring alert LED.

FIG. 10 is a view illustrating an electronic device according to a sixth exemplary embodiment of the present invention and illustrates a front view of a display unit 1001 constructed by combining the plurality of light source charging solar batteries 601 in FIG. 8 and an enlarged front view of the light source charging solar battery 601.

The exemplary embodiment of the present invention uses the plurality of light source charging solar batteries 601 as a display element. Specifically, there are used the plurality of light source charging solar batteries 601, each of which serves as an element including the light source 504, the solar battery 202 for photoelectric-converting the light from the light source 504 and the external light 205 and the charging battery 113 for storing electric energy from the solar battery 202. The light source 504 of each of the light source charging solar batteries 601 is used as a pixel.

The each light source charging solar battery 601 includes protrusions 1002 and recesses 1003 around there and the protrusions 1002 and the recesses 1003 of the each light source charging solar battery 601 engage with other recesses 1003 and protrusions 1002 of adjacent light source charging solar batteries 601, respectively.

The each light source charging solar battery 601 is structured to be independent of other light source charging solar batteries 601 for independent removal.

The light source 504 of the each light source charging solar battery is available as a pixel backlight in place of a pixel.

In the case of including a display element, the light source is available as a pixel or backlight, thus compensating for electric power supplied from an electric supply with a simple structure.

A combination of the plurality of light source charging solar batteries can construct a giant display unit 1001 for a giant screen or a scoreboard used in the open.

In addition, the light from the light source 504 and the external light 205 are received by the solar battery 202 and the photoelectric-converted electricity is charged into the secondary cell 113, thereby attaining low power consumption and low electrical rate.

Because the each light source charging solar battery 601 is structured to be independent of each other for removal, when replacement or removal is needed for product service life or repair, only the light source charging solar battery 601 required for replacement or repair is slid in a perpendicular direction to a paper face in FIG. 10 and removed, thus facilitating replacement and repair. Easy replacement by removing only one light source charging solar battery 601 in this way can reduce replacement cost.

The adjacent light source charging solar batteries 601 are connected with each other through protrusions 1002 and recesses 1003 as connection portions and are structured to be slidable independently in a perpendicular direction to a paper face in FIG. 10 and therefore it can be made not only on a flat surface, but also made to have projections and depressions.

In addition, a combination of the plurality of light source charging solar batteries 601 into various types of shapes can construct a display unit having any of various shapes such as round, triangle and trapezoid.

For example, a combination of the plurality of light source charging solar batteries 601 into a circle can construct a display unit 1101 having an oval as shown in a seventh exemplary embodiment illustrated in FIG. 11.

INDUSTRIAL APPLICABILITY

The present invention is applicable to a portable electronic device which is powered by a secondary cell as well as a mobile phone, PHS (Personal Handyphone System), PDA (Personal Data Assistance, Personal Digital Assistants Personal Portable Telecommunications Equipment), an electronic dictionary and a portable personal computer. Further, the present invention is also applicable to various sizes and types of light sources and display units.

DESCRIPTION OF SYMBOLS

Figure 1:
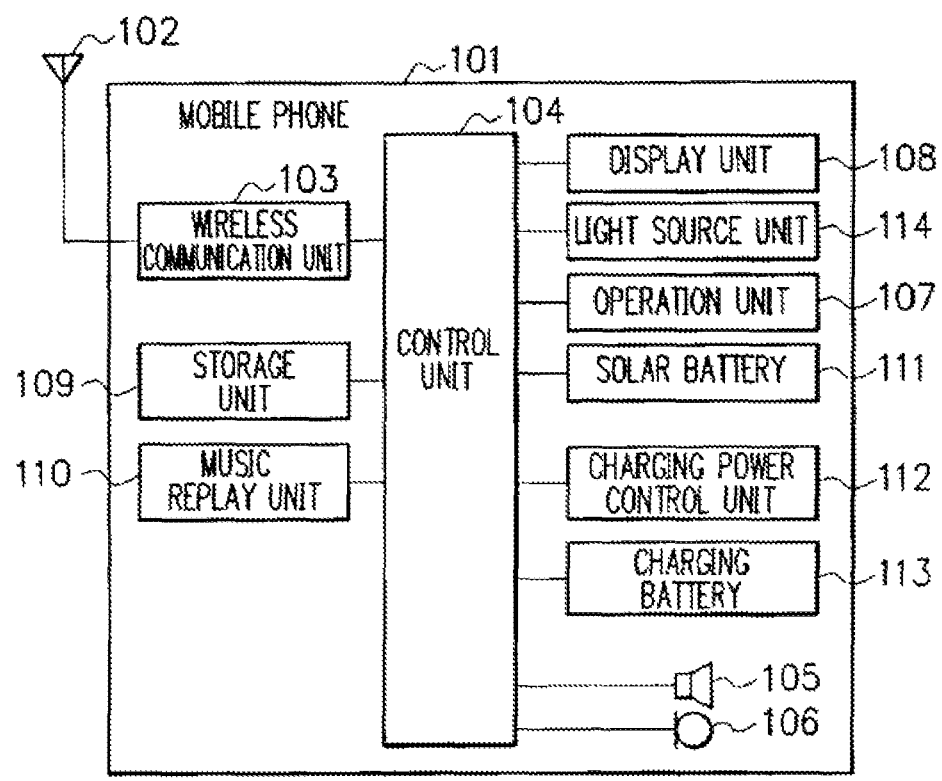
FIG. 1 is a block diagram illustrating a configuration of an electronic device with a power generation function according to a first exemplary embodiment of the present invention.
Figure 2:
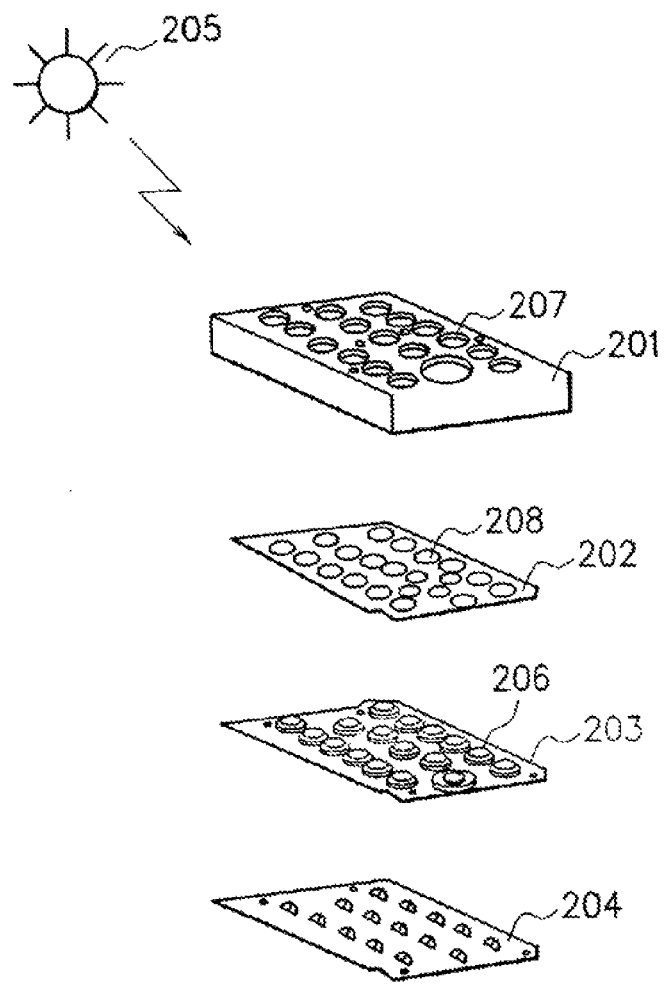
FIG. 2 is an exploded perspective view of a mobile phone with a power generation function according to the first exemplary embodiment of the present invention.
Figure 3:
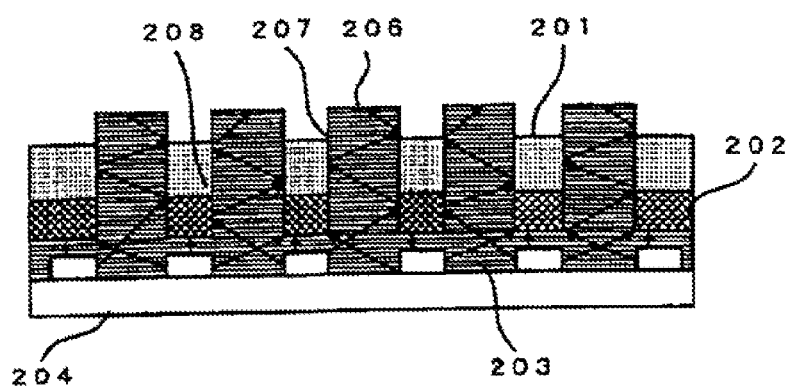
FIG. 3 is a side sectional view of the mobile phone with a power generation function according to the first exemplary embodiment of the present invention.
Figure 4:
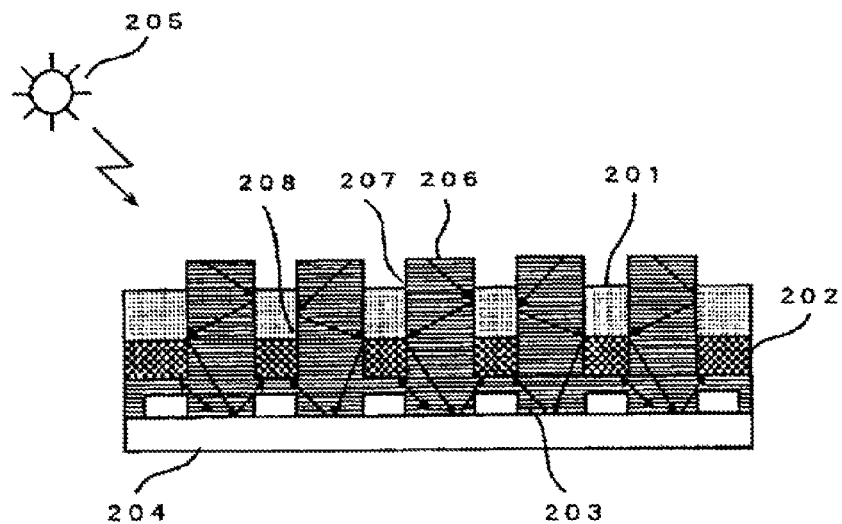
FIG. 4 is a side sectional view of the mobile phone with a power generation function according to the first exemplary embodiment of the present invention.
Figure 5:
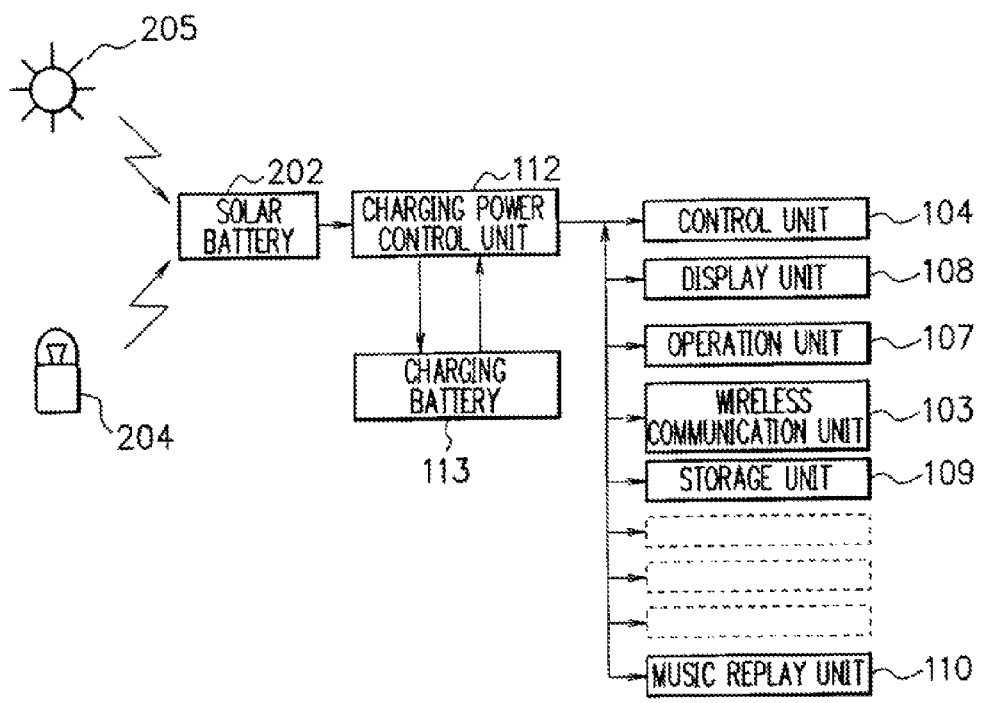
FIG. 5 is a block diagram illustrating operations of the electronic device with a power generation function according to the first exemplary embodiment of the present invention.
Figure 6:
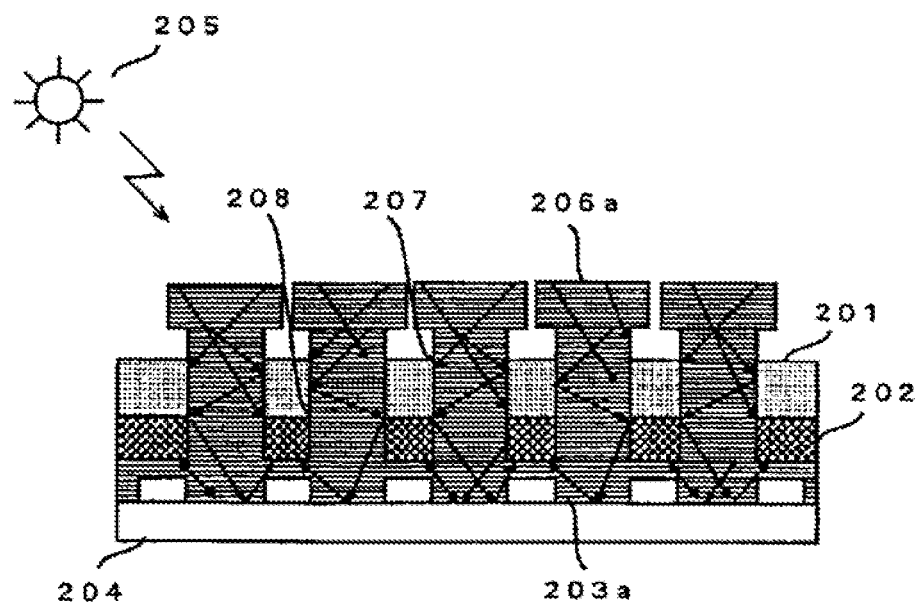
FIG. 6 is a side sectional view of an electronic device according to a second exemplary embodiment of the present invention.
Figure 7:
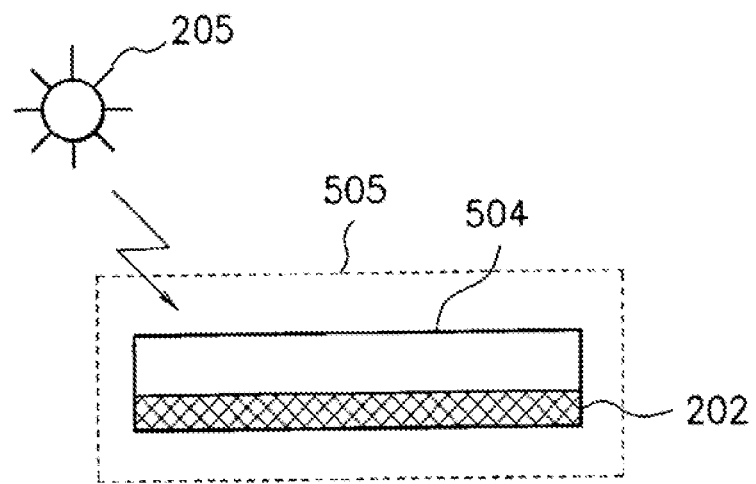
FIG. 7 is a side sectional view of a light source solar battery used in an electronic device according to a third exemplary embodiment of the present invention.
Figure 8:
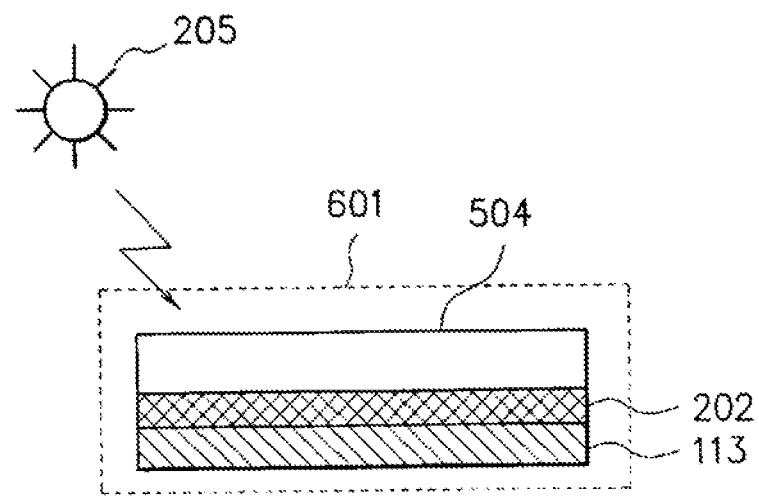
FIG. 8 is a side sectional view of a light source charging solar battery used in an electronic device according to a fourth exemplary embodiment of the present invention.
Figure 9:
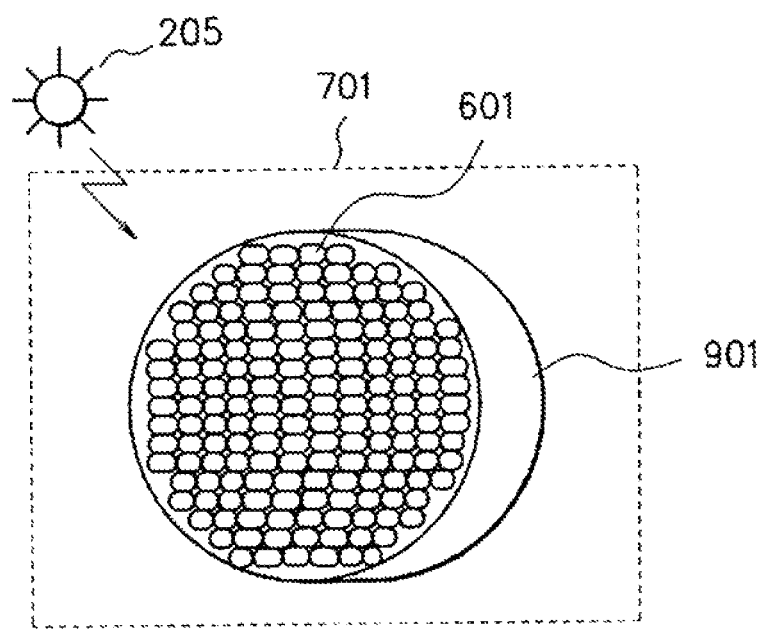
FIG. 9 is a view illustrating an electronic device according to a fifth exemplary embodiment of the present invention.
Figure 10:
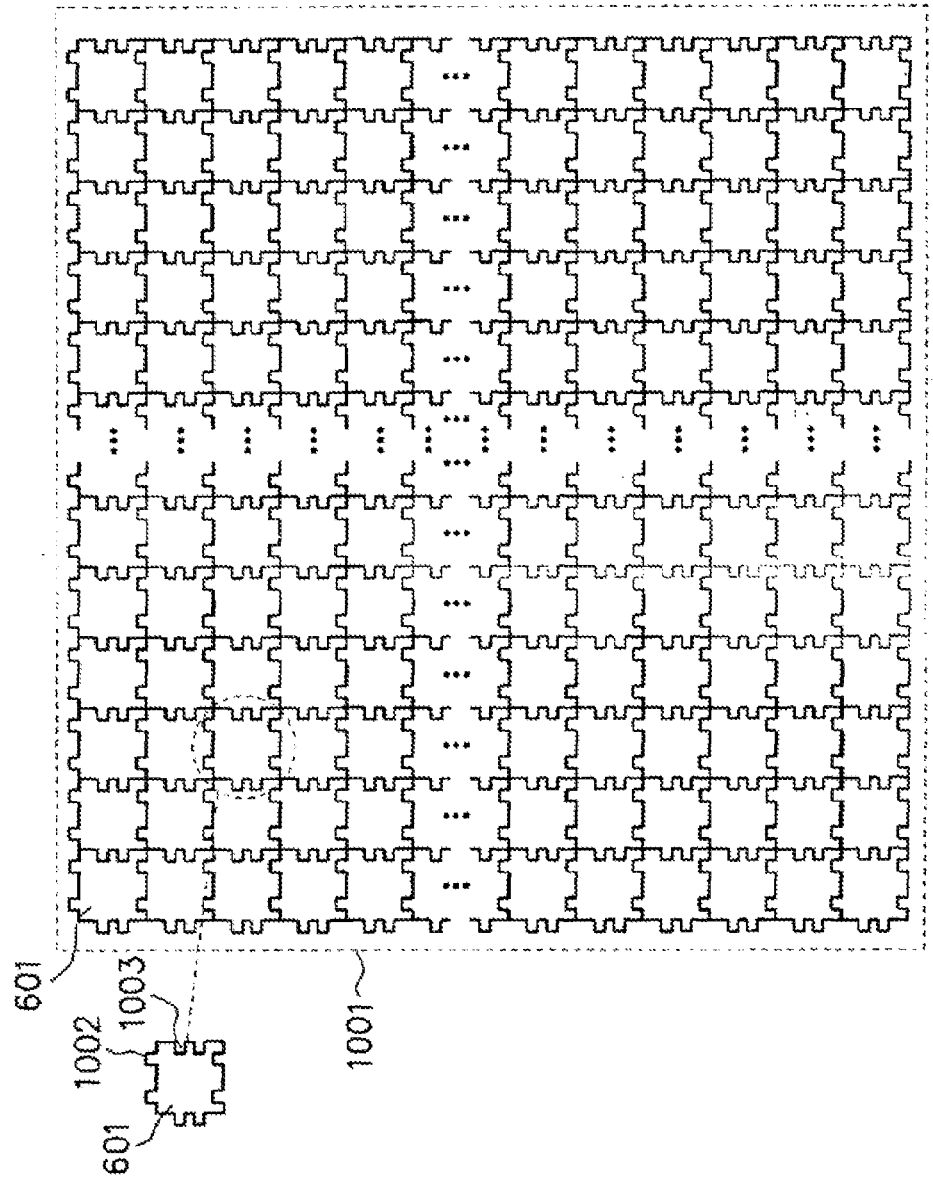
FIG. 10 is a view illustrating an electronic device according to a sixth exemplary embodiment of the present invention.
Figure 11:
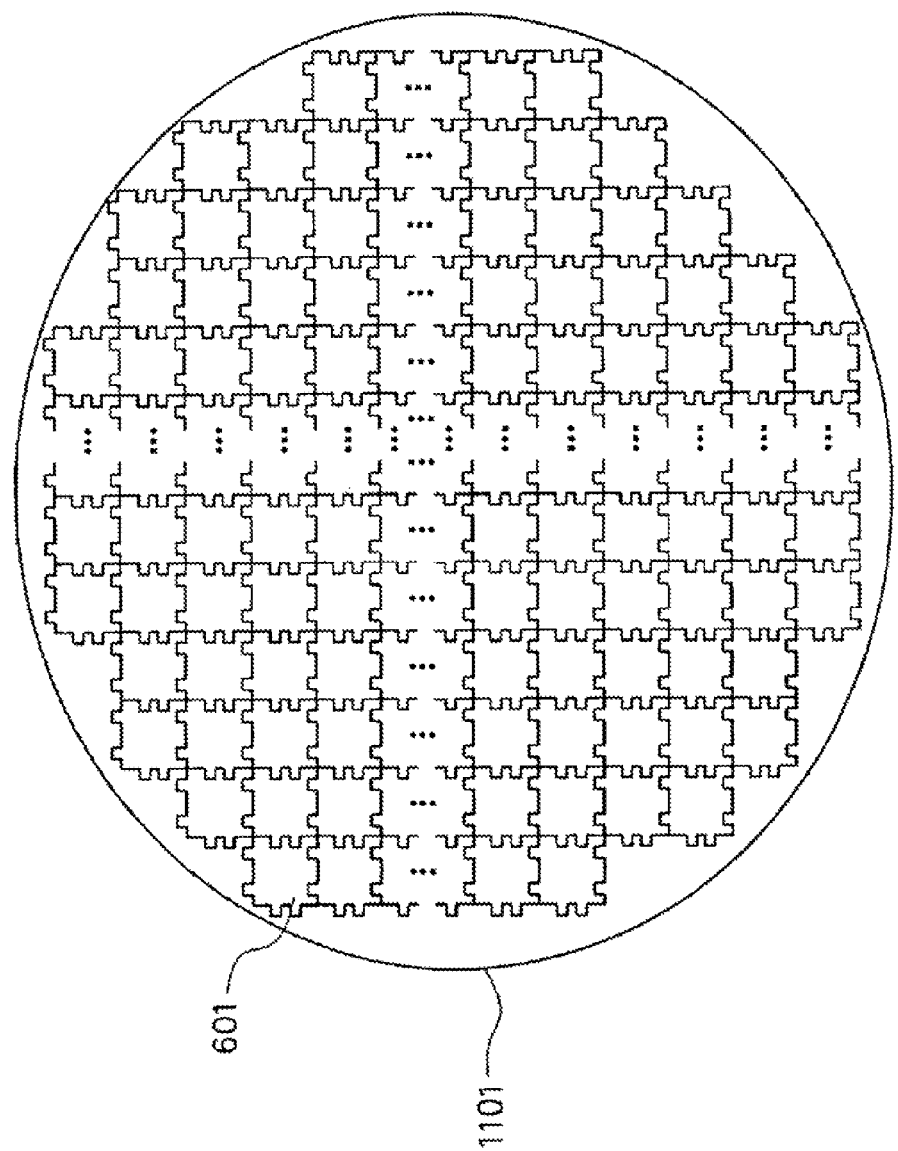
FIG. 11 is a view illustrating an electronic device according to a seventh exemplary embodiment of the present invention.

101 MOBILE PHONE AS ELECTRONIC DEVICE
102 ANTENNA
103 COMMUNICATION UNIT
104 CONTROL UNIT
105 SPEAKER
106 MICROPHONE
107 OPERATION UNIT
108 DISPLAY UNIT
109 STORAGE UNIT
110 MUSIC REPLAY UNIT
111 SOLAR BATTERY UNIT
112 CHARGING POWER CONTROL UNIT
113 CHARGING BATTERY AS SECONDARY CELL
114 LIGHT SOURCE UNIT
201 CASING
202 SOLAR BATTERY AS PHOTOELECTRIC CONVERSION ELEMENT
203, 203a KEY SHEET
204, 504 LIGHT SOURCE
205 EXTERNAL LIGHT
206, 206a OPERATION KEY
207 FIRST THROUGH-HOLE
208 SECOND THROUGH-HOLE
505 LIGHT SOURCE SOLAR BATTERY
601 LIGHT SOURCE CHARGING SOLAR BATTERY AS OPTICAL CHARGING ELEMENT
701 LIGHT
901 SUPPORT BASE
1001, 1101 DISPLAY UNIT
1002 PROTRUSION
1003 RECESS

The invention claimed is:

1. An electronic device comprising:
a light source;
a photoelectric conversion element for receiving light and converting the light into electric energy;
a key sheet for having a plurality of operation keys and guiding the light from the light source and external light into the photoelectric conversion element and guiding the light from the light source onto the operation key; and
a secondary cell for storing electric energy from the photoelectric conversion element,
wherein:

the electronic device includes a casing including a plurality of first through-holes for exposing the plurality of operation keys to a surface side thereof;

the photoelectric conversion element includes a plurality of second through-holes corresponding to the first through-holes and is disposed on a rear face of the casing;

the key sheet is made of a material with light conductivity and is disposed on the rear face of the photoelectric conversion element and the plurality of operation keys protrude to the outside of the casing through the first and second through-holes;

the light source is disposed on a rear face of the key sheet; and the key sheet guides the light from the light source and the external light from the outside of the casing into the photoelectric conversion element.

2. The electronic device according to claim 1, wherein an area of an external face of the operation key protruding to the outside of the casing is formed to be larger than the first and the second through-holes.

3. The electronic device according to claim 1, wherein the light source is a backlight of the operation key.

4. The electronic device according to claim 1, wherein the light source has translucency and is layered on the photoelectric conversion element.

5. The electronic device according to claim 4, wherein the photoelectric conversion element is layered on the secondary cell.

* * * * *